United States Patent [19]
Inushima et al.

[11] Patent Number: 5,469,424
[45] Date of Patent: Nov. 21, 1995

[54] ELECTRONIC DEVICE UTILIZING A MATERIAL CAPABLE OF STORING INFORMATION WHICH IS READABLE BY ILLUMINATION

[75] Inventors: Takashi Inushima; Rimantas Vaitkus, both of Kanagawa, Japan

[73] Assignee: Semiconductor Energy Laboratory Co., Ltd., Kanagawa, Japan

[21] Appl. No.: 199,955

[22] Filed: Feb. 22, 1994

[30] Foreign Application Priority Data

Feb. 23, 1993 [JP] Japan .................................. 5-057963

[51] Int. Cl.$^6$ ...................................................... G01J 1/02
[52] U.S. Cl. ........................... 369/120; 369/101; 369/100
[58] Field of Search ..................................... 369/120, 100, 369/101, 121; 359/350; 250/365, 336.1, 338.4; 257/77

[56] References Cited

U.S. PATENT DOCUMENTS 5,162,886  11/1992  Nishibayashi ........................... 257/421

FOREIGN PATENT DOCUMENTS 5281030  10/1993  Japan .

*Primary Examiner*—Georgia Y. Epps
*Assistant Examiner*—Ricky Mack
*Attorney, Agent, or Firm*—Sixbey, Friedman, Leedom & Ferguson; Gerald J. Ferguson, Jr.; Evan R. Smith

[57] ABSTRACT

An electronic device comprising a diamond illuminated with ultraviolet radiation, a light source for illuminating the diamond with visible light, and a means for measuring a photocurrent induced in the diamond. The ultraviolet radiation has wavelengths shorter than about 230 nm corresponding to the energy bandgap of the diamond and is made to impinge on the diamond. Then, the light which has wavelengths longer than about 230 nm is made to impinge on the diamond. The photocurrent induced in the diamond is measured. In this way, the amount of the previously emitted ultraviolet radiation having wavelengths shorter than about 230 nm is known. Although the diamond is a primary substance to be illuminated, the substance to be illuminated comprises a material selected from a group consisting of diamond, boron nitride, aluminum nitride and a multi-layer thereof.

25 Claims, 8 Drawing Sheets

ELECTRONIC DEVICE UTILIZING A MATERIAL CAPABLE OF STORING INFORMATION WHICH IS READABLE BY ILLUMINATION

FIELD OF THE INVENTION

The present invention relates to an electronic device which uses a diamond and is capable of detecting the amount of UV (ultraviolet) light impinging on the device and of reading and writing information to and from the diamond by illuminating the diamond with UV light.

BACKGROUND OF THE INVENTION

Alkalide phosphors which are sensitive to ultraviolet radiation have been chiefly used to detect ultraviolet radiation. Also, photomultipliers are known as UV detectors. Although sensitive to UV light, they are unable to record information contained in UV light.

Also, a UV detector making use of a diamond has been proposed. This utilizes a change in the sensitivity of the diamond to UV light, i.e., a change in the electrical conductivity of the diamond caused by UV illumination. Thus UV detector is not capable of recording information contained in the impinging UV light.

On the other hand, a method exploiting photoluminescence has come to be known as a result of researches conducted recently. In this method, BaFBr doped with Eu or RbBr doped with T1 is illuminated with UV light or visible light. The amount of the illuminating light is read by illuminating BaFBr or RbBr with stimulating light consisting of infrared light. However, this method using photoluminescence is still in the research and development stage and has poor practicability.

The above-described photoluminescence can be roughly understood from a model described below. BaFBr or the like is doped with Eu that is a phosphor. UV light having energies greater than the bandgap energy of the phosphor is emitted, so that electron-hole pairs are generated inside the phosphor. Some of the electron-hole pairs are trapped in lattice defects and in the centers of capture of positive holes or electrons which are created by impurities. Since these centers of capture are located deep in the bandgap, electrons and positive holes captured in the centers are in stable state even at room temperature. The levels of the energies at which the centers of capture exist correspond to the energies of the light in the infrared region. Accordingly, light at these levels is directed as stimulating light to the phosphor. In this way, electrons and positive holes captured in the centers of capture recombine, thus emitting light.

However, when one attempts to measure the amount of the illuminating UV light by making use of the above-described phenomenon, the intensity of light emitted from the phosphor is so weak that the method is not practical. The intensity of the emitted light may be effectively increased by increasing the thickness of the phosphor film. If the phosphor film thickness is increased, the intensity of the illuminating UV light and the intensity of the stimulating light for reading the amount of illuminating UV light must be increased. If the intensity of the reading light is increased, local heating occurs. The produced heat diffuses to the surroundings. This deteriorates the resolution at which information is read out. If the thickness of the film of the phosphor is increased, scattering of the light is increased. This also leads to a decrease in the resolution at which information is read and written.

SUMMARY OF THE INVENTION

It is an object of the present invention to provide a device and method for measuring the amount of illuminating UV light.

It is another object of the invention to provide an electronic device which can read and write information by making use of the device and method described in the preceding paragraph.

It is a further object of the invention to provide a method of operating the electronic device described in the preceding paragraph.

A first aspect of the present invention lies in an electronic device comprising:

a substance to be illuminated with ultraviolet radiation, said substance comprising a material having photoconductivity, an energy bandgap and a trap level;

means for illuminating said substance with light having a wavelength corresponding to an energy smaller than an energy bandgap of said substance to induce a photocurrent in said substance; and means for measuring said photocurrent.

The inventors consider the operating model of the electronic device of the present invention as follows.

(a) Numerous impurities and lattice defects exist in said substance, and these form trap levels over the whole energy bandgap.

(b) Accordingly, UV light for exciting electrons in said substance is made to hit said substance to optically induce electrons and positive holes. The electrons and the positive holes are captured in the trap levels in such a manner that they correspond to information about the amount of the illuminating UV light.

(c) If light having an energy necessary to excite them out of the trap levels, i.e., light having an energy less than the energy bandgap of said substance, is irradiated to said substance as reading light, a photocurrent is induced by electrons excited out of the trap levels. The amount of the illuminating UV light is determined from this photocurrent.

Said substance comprises, e.g., diamond, boron nitride, aluminum nitride, or a multi-layer thereof.

The ultraviolet radiation, or UV light, referred to herein is light having, or consisting primarily of, wavelengths shorter than about 230 nm. Expressed in eV, the wavelength of about 230 nm roughly agrees with about 5.5 eV, or the energy bandgap of diamond. In the present specification, an approximate equation given by $\lambda \times E(\lambda) = 1240$ is used to express the wavelength of light in eV. In this equation, $\lambda$ is the wavelength of light expressed in nm, and $E(\lambda)$ is the wavelength expressed in eV.

In the present invention, no limitations are imposed on the kind of the diamond. Either synthetic diamond or natural diamond may be used. Also, no restrictions are placed on the method of fabrication of synthetic diamond. However, use of a thin-film diamond manufactured by CVD which provides a large area is useful.

It is also known that one conductivity type is imparted to a diamond by implanting an impurity into it. No limitations are imposed on the conductivity type of the diamond used in the present invention.

The energy corresponding to the energy less than the energy bandgap of diamond means a wavelength having an energy lower than the energy bandgap of diamond, or 5.5 eV. Since the relation E(λ)=5.5 eV holds, the wavelength having the energy corresponding to 5.5 eV is roughly calculated at 230 nm according to the equation above. Therefore, wavelengths corresponding to energies less than the energy bandgap of diamond are in excess of about 230 nm.

Examples of wavelengths longer than about 230 nm as described above include normal visible light, white light, various kinds of laser light (e.g., He—Ne laser light having a wavelength of 633 nm). Also, the light can be emitted continuously or take the form of pulsed light.

The aforementioned photocurrent is an electrical current flowing through a sample when a voltage is applied across it while the sample is illuminated with light. The current is induced because the conductance varies according to the sensitivity of the sample to incident light.

The photocurrent referred to herein is defined as a conduction current flowing through a diamond when it is illuminated with light. The photocurrent flowing through the diamond is measured in the manner described now. A voltage is applied across the diamond. Under this condition, the diamond is illuminated with light. At this time, an electrical current is induced in the diamond. This current is measured.

The fundamental operation of the first aspect described above is as follows.

(a) After or during illumination of ultraviolet radiation, light such as visible light having a wavelength corresponding to an energy lower than the energy bandgap of diamond is made to impinge on the diamond.

(b) The photocurrent flowing through the diamond during illumination of the visible light is measured. Thus, information about the UV light impinging on the diamond is obtained. The value of the photocurrent induced in the diamond by illumination of visible light is affected by the UV illumination. Utilizing this phenomenon, the information about the UV light is derived. The presence or absence of the UV illumination can be known by measuring the photocurrent.

A second aspect of the invention lies in an electronic device comprising: a diamond having an energy bandgap and illuminated with ultraviolet radiation; a means for illuminating said diamond with light having a wavelength corresponding to an energy smaller than the energy bandgap of said diamond to induce a photocurrent in said diamond; a means for measuring a peak value of said photocurrent; and a means for determining an amount of said ultraviolet radiation impinging on said diamond from said peak value of the photocurrent.

The aforementioned means for measuring the peak value of the photocurrent induced in the diamond must deliver some form of output indicating the peak value of the photocurrent flowing through the diamond. For example, this means comprises a current amplifier for amplifying the photocurrent and a portion that stores and delivers the peak value of the output.

The amount of the ultraviolet radiation is a physical amount given by (the radiant intensity of light×irradiation time of light). As an example, the amount of the radiation is expressed in μWs/cm².

The aforementioned means for determining the amount of said ultraviolet radiation impinging on said diamond from said peak value of the photocurrent is capable of calculating the amount of the illuminating ultraviolet radiation from information about the peak value of the photocurrent. For example, the relation of values of photocurrent to various amounts of the illuminating UV light is previously stored in a memory. The information stored in the memory is compared with the value of photocurrent. Then, the amount of the UV light impinging on the diamond is computed.

A third aspect of the invention lies in an electronic device comprising: a means for illuminating a diamond having an energy bandgap with ultraviolet radiation which has an amount of radiation corresponding to given information; a means for illuminating said diamond with light having a wavelength corresponding to an energy smaller than the energy bandgap of said diamond to induce a photocurrent in said diamond; a means for measuring a peak value of said photocurrent; and a means for obtaining said given information from the peak value of said photocurrent.

In the third aspect described above, the means for illuminating ultraviolet radiation having an amount of radiation corresponding to given information makes different pieces of information correspond to various amounts of the illuminating ultraviolet radiation and emits an amount of ultraviolet radiation which carries a certain piece of information. It is assumed that information A and information B exist. Information A is made to correspond to an amount of radiation 5 μWs/cm². Information B is made to correspond to an amount of radiation 10 μWs/cm². These two amounts of radiation can be selectively emitted. The UV light impinging on the diamond has been already defined in the description of the first aspect. That is, it is defined as light having, or consisting mainly of, a wavelength shorter than a wavelength converted into an energy corresponding to about 5.5 eV. The UV light source can be a special laser, a deuterium discharge lamp, or a high-energy particle generator.

The means for obtaining said given information from the peak value of said photocurrent is capable of calculating information indicated by the amount of UV light impinging on the diamond from the peak value of the photocurrent. This means can be built in the manner described now. Information corresponding to various amounts of the UV light has been previously stored in a memory. The information stored in the memory is compared with the amount of the UV light obtained from the peak value of the photocurrent. Then, the information possessed by the illuminating UV light is judged.

A fourth aspect of the present invention lies in an electronic device comprising: a plurality of storage regions formed on a diamond having an energy bandgap; a means for illuminating said storage regions with ultraviolet radiation; a means for illuminating said storage regions with light having a wavelength corresponding to an energy smaller than the energy bandgap of said diamond to induce a photocurrent in said storage regions; and a means for measuring said photocurrent.

In the fourth aspect of the invention, a plurality of storage regions are formed on the surface of the diamond. Information is written into the storage regions by UV illumination. The information is read from the storage regions by measuring a photocurrent which is induced by illumination of light having a wavelength corresponding to an energy less than the energy bandgap of the diamond.

A fifth aspect of the present invention lies in an electronic device comprising: a plurality of storage regions formed on a diamond having an energy bandgap; a means for illuminating said storage regions with ultraviolet radiation having an amount of radiation corresponding to given information; a means for illuminating said storage regions with light having a wavelength corresponding to an energy less than the energy bandgap of said diamond to induce a photocurrent in said storage regions; a means for measuring a peak value of said photocurrent; and a means for obtaining said given information from the peak value of said photocurrent.

In this fifth aspect of the invention, given information is stored in the storage regions on the surface of the diamond. Information about UV doses corresponding to the given information is read by measuring the peak value of the photocurrent when light having a wavelength corresponding to an energy less than the energy bandgap of the diamond is emitted. In this fifth aspect, different kinds of information can be written into the storage regions by emitting different amounts of UV light.

A sixth aspect of the present invention lies in a method of operating an electronic device having a diamond, said method comprising the steps of: illuminating said diamond having an energy bandgap with ultraviolet radiation; illuminating said diamond with light having a wavelength corresponding to an energy less than the energy bandgap of said energy and measuring a resulting photocurrent; and obtaining information about the ultraviolet radiation impinging on said diamond from said photocurrent.

A seventh aspect of the present invention is based on the sixth aspect and characterized in that the amount of the ultraviolet radiation impinging on the diamond is measured by detecting the peak value of the photocurrent.

An eighth aspect of the present invention lies in a method of operating an electronic device having a diamond, said method comprising the steps of: illuminating said diamond having an energy bandgap with ultraviolet radiation having an amount of radiation corresponding to given information to write said given information into the diamond; illuminating said diamond with reading light having a wavelength corresponding to an energy less than the energy bandgap of said diamond to induce a photocurrent; and reading the given information stored in said diamond from a peak value of said photocurrent.

This eighth aspect pertains to a method of operating an electronic device using a diamond capable of acting as a memory. Information is written into the diamond with UV light. The information is read out with light having a wavelength corresponding to an energy less than the energy bandgap of the diamond.

That is, in the present invention, information corresponding to the amount of illuminating UV light is written. Also, information corresponding to the amount of the illuminating UV light is read out. For this purpose, the amount of illuminating UV light is calculated from the peak value of the photocurrent induced by illumination of the reading light. This calculated value is compared with a previously set relation between the amount of illuminating UV light and the given information.

A ninth aspect of the present invention is based on the eighth aspect of the invention and is characterized in that a plurality of reading operations are performed per writing operation by using pulsed light as reading light.

A tenth aspect of the invention is based on the eighth aspect of the invention and is characterized in that information written with ultraviolet radiation is erased by using white light as reading light.

An eleventh aspect of the invention lies in an electronic device comprising: a diamond having an energy bandgap; a filter for attenuating light having wavelengths corresponding to energies less than the energy bandgap of said diamond; a means for illuminating said diamond with light having a wavelength corresponding to an energy less than the energy bandgap of said diamond to induce a photocurrent in said diamond; and a means for measuring said photocurrent.

The filter for attenuating light having wavelengths corresponding to energies less than the energy bandgap of said diamond is an optical filter which attenuates light having wavelengths longer than about 230 nm corresponding to the energy bandgap of the diamond and transmits light having wavelengths shorter than about 230 nm.

As can be understood from the description made thus far, the fundamental operation of these aspects of the invention is that the amount of ultraviolet radiation having wavelengths shorter than about 230 nm is read with light having wavelengths longer than about 230 nm. When the amount of the UV light impinging on the diamond is measured, the light falling on the diamond might contain wavelengths longer than about 230 nm, as well as wavelengths shorter than about 230 nm. Of course, if the amount of light having wavelengths shorter than about 230 nm is sufficiently large, and if the effects of light of wavelengths longer than about 230 nm can be neglected as encountered in the outer space, then it is not necessary to take account of the effects of wavelengths longer than about 230 nm.

However, in an environment where the amount of visible light is larger than the amount of UV light as on the earth, if the diamond is illuminated with light having wavelengths shorter than about 230 nm, then the diamond is simultaneously illuminated with wavelengths longer than about 230 nm. It follows that information regarding the amount of UV light having wavelengths shorter than about 230 nm is written into the diamond. At the same time, the information is read out with light having wavelengths longer than about 230 nm. Especially, where white light is emitted, the information written with the UV light is erased. The information cannot be read out again. That is, if white light is emitted to erase information about the UV light, and if visible light is then emitted and the resulting photocurrent is measured, then information concerning the UV light impinging on the diamond prior to the illumination of the white light cannot be obtained.

In this case, therefore, it is necessary to sufficiently attenuate light having wavelengths longer than about 230 nm so that the effects can be neglected. Thus, the light falling on the diamond consists principally of wavelengths shorter than about 230 nm. In this way, the amount of light having wavelengths shorter than about 230 nm and impinging on the diamond can be precisely measured by illumination of light having wavelengths longer than about 230 nm. Consequently, an optical filter for attenuating light of wavelengths longer than about 230 nm is needed.

A filter which transmits electromagnetic waves having frequencies higher than a certain frequency determined by the plasma frequency of a metal having free electrons and reflects electromagnetic waves having frequencies lower than the certain frequency is used as the aforementioned filter for attenuating light having wavelengths longer than about 230 nm.

For example, copper is made to transmit electromagnetic waves having energies exceeding about 5.5 eV and to reflect electromagnetic waves having energies less than about 5.5 eV, by controlling the number of free electrons in the copper. Therefore, an optical filter which cuts off light of wavelengths longer than about 230 nm and transmits light of wavelengths shorter than 230 nm can be obtained by using a copper plate as a filter. The number of free electrons in a metal can be controlled by annealing or other method during fabrication of the filter.

In order to realize a structure which cuts off a certain one of wavelengths of light shorter than about 230 nm and to transmit only desired ultraviolet radiation to a diamond, a substance which filters out certain wavelengths of light can be used. For example, aluminum transmits light having energies exceeding about 13 to 14 eV. Aluminum can be employed as a filter to detect the amount of light having energies exceeding about 13 to 14 eV without being affected by light having energies less than about 13 to 14 eV.

First, a diamond is illuminated with ultraviolet radiation having energies exceeding about 5.5 eV, i.e., having wavelengths shorter than about 230 nm. Information about the amount of the illuminating UV light is stored in the diamond.

During or after irradiation of the UV light, the diamond is illuminated with light having energies less than about 5.5 eV, i.e., wavelengths longer than about 230 nm, thus inducing a photocurrent in the diamond. By measuring the peak value of the photocurrent, the amount of the UV light impinging on the diamond before the measurement can be measured.

Other objects and features of the invention will appear in the course of the description thereof, which follows.

DETAILED DESCRIPTION OF THE INVENTION

Figure 2A:
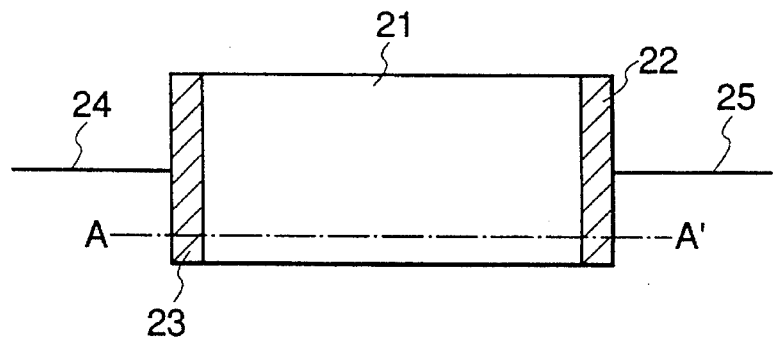
FIGS. 2(a) and 2(b) are cross sections of an ultraviolet detector used in an electronic device according to the invention.
Figure 2B:
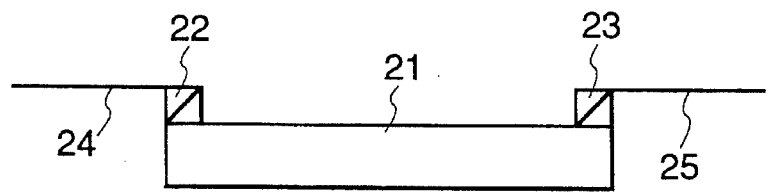

Referring to FIG. 2, (a) and (b), there is shown a UV detector according to the invention. FIG. 2(a) is a top view of the UV detector. FIG. 2(b) is a cross-sectional view taken on line A—A— of FIG. 2(a). The operation and its features of the UV detector will be described based on experimental data. This detector comprises a thin diamond film 21, a pair of electrodes 22, 23, and a pair of output electrodes 24, 25.

Figure 1:
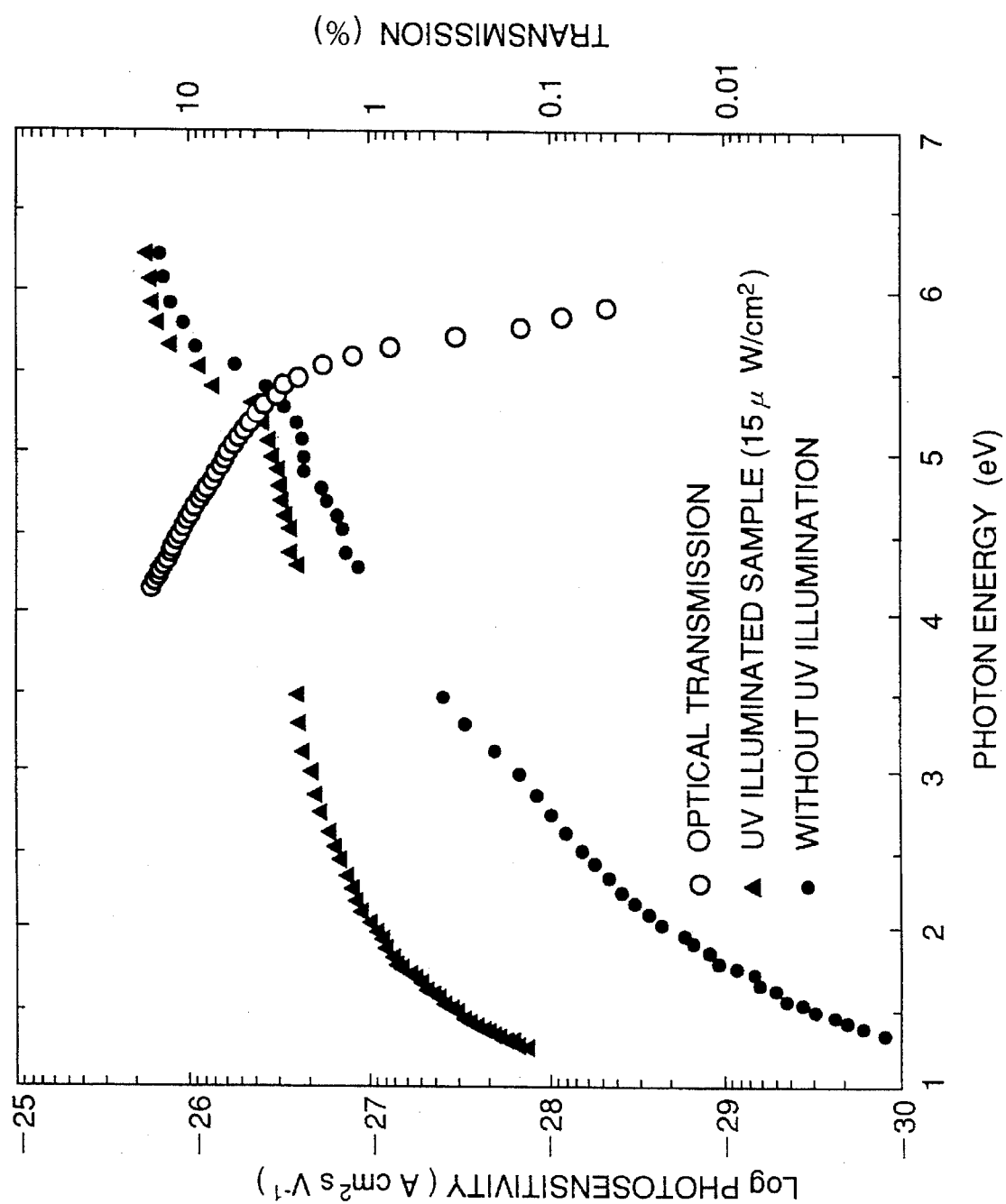
FIG. 1 is a diagram showing the relation of the sensitivity of a thin diamond film to energies corresponding to wavelengths of light when the diamond film is illuminated with the light.

FIG. 1 shows the relation of logarithmic values of the photosensitivity of the diamond film 21 of the UV detector to the photon energy of light impinging on the diamond film 21. Also, the relation of the photon energy of the light impinging on the diamond film to the transmission, or transmittance, of the diamond film is shown. In the graph, the photon energy is plotted on the horizontal axis. In practice, the wavelength of the light corresponds to the other parameters. That is, the wavelength of the light is converted into energy expressed in electron volts (eV) and plotted on the horizontal axis.

In FIG. 1, white circles indicate the dependence of the transmission of the diamond film on wavelength, which should be read on the right scale. Black triangles are obtained by illuminating the diamond film with light of wavelengths of 180 to 380 nm corresponding to energies of about 6.9 to 3.3 eV, and measuring the photosensitivity of the diamond film 21. The light of wavelengths of 180 to 380 nm whose corresponding energies are plotted on the horizontal axis is produced by a deuterium discharge lamp, the intensity of the light being 15 µW/cm$^2$. Black circles indicate the photosensitivity when only light having wavelengths plotted on the horizontal axis is emitted without illuminating the deuterium discharge lamp.

We now take notice of the white circles. It can be seen that the transmission drops rapidly from around 5.5 eV. This indicates that the energy bandgap of the thin diamond film is approximately 5.5 eV corresponding to a wavelength of about 230 nm. With respect to black circles, the photosensitivity increases with increasing the energy of the illuminating light, i.e., as the wavelength of the illuminating light shortens.

With respect to the black triangles, the photosensitivity is almost constant at wavelengths having energies exceeding about 2.8 eV corresponding to a wavelength of about 440 nm. Above about 5 eV corresponding to a wavelength of about 250 nm, the black triangles assume values close to the values indicated by the black circles which are obtained when the deuterium discharge lamp is not lit up. Comparing the results (indicated by the black triangles) of measurements of the photosensitivity made while the deuterium discharge lamp is producing UV light with the results (indicated by the black circles) of measurements of the photosensitivity made without the UV irradiation shows that their trajectories are almost the same above about 4.8 eV and differ widely below about 5 eV. The energy of about 5 eV is quite close to the energy bandgap of diamond, or about 5.5 eV. We observe that both values are almost coincident.

It can be seen from FIG. 1 that the photosensitivity to light of energies less than about 5 eV corresponding to wavelengths about 250 nm and above is affected by the illumination of the UV light from the deuterium discharge lamp. Thus, we can conclude that the photosensitivity obtained when light of energies less than about 5 eV contains information about illumination of wavelengths exceeding 5 eV of the UV light emitted from the deuterium discharge lamp.

We can conclude from the foregoing that when the diamond is illuminated with UV light having wavelengths shorter than the wavelength approximately corresponding to the energy bandgap of the diamond, the information can be taken from the photocurrent by illuminating the diamond with light having wavelengths longer than the wavelength substantially corresponding to the energy bandgap of the diamond.

Figure 2C:
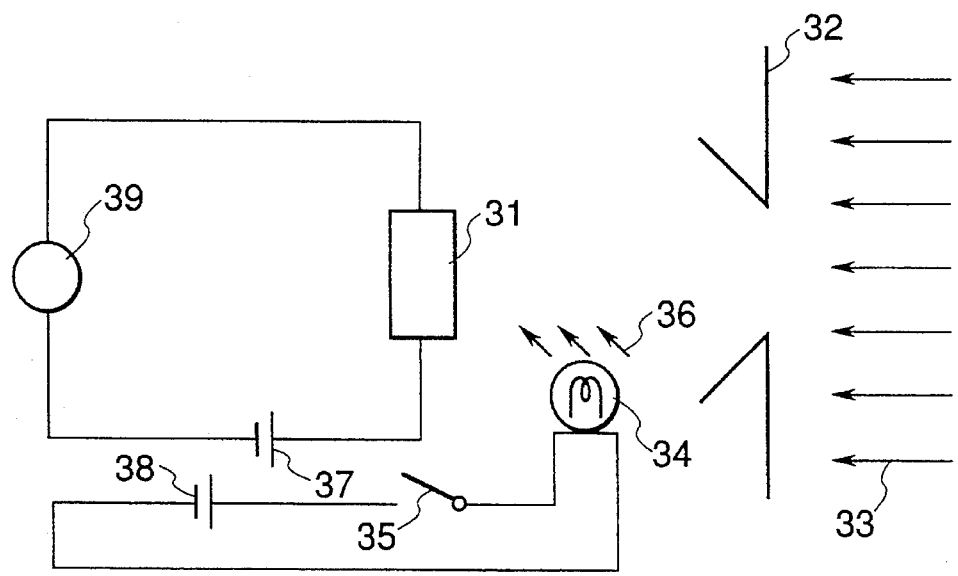
FIG. 2(c) is a schematic diagram of an ultraviolet dosimeter using the ultraviolet detector shown in FIGS. 2(a) and 2(b)
Figure 3:
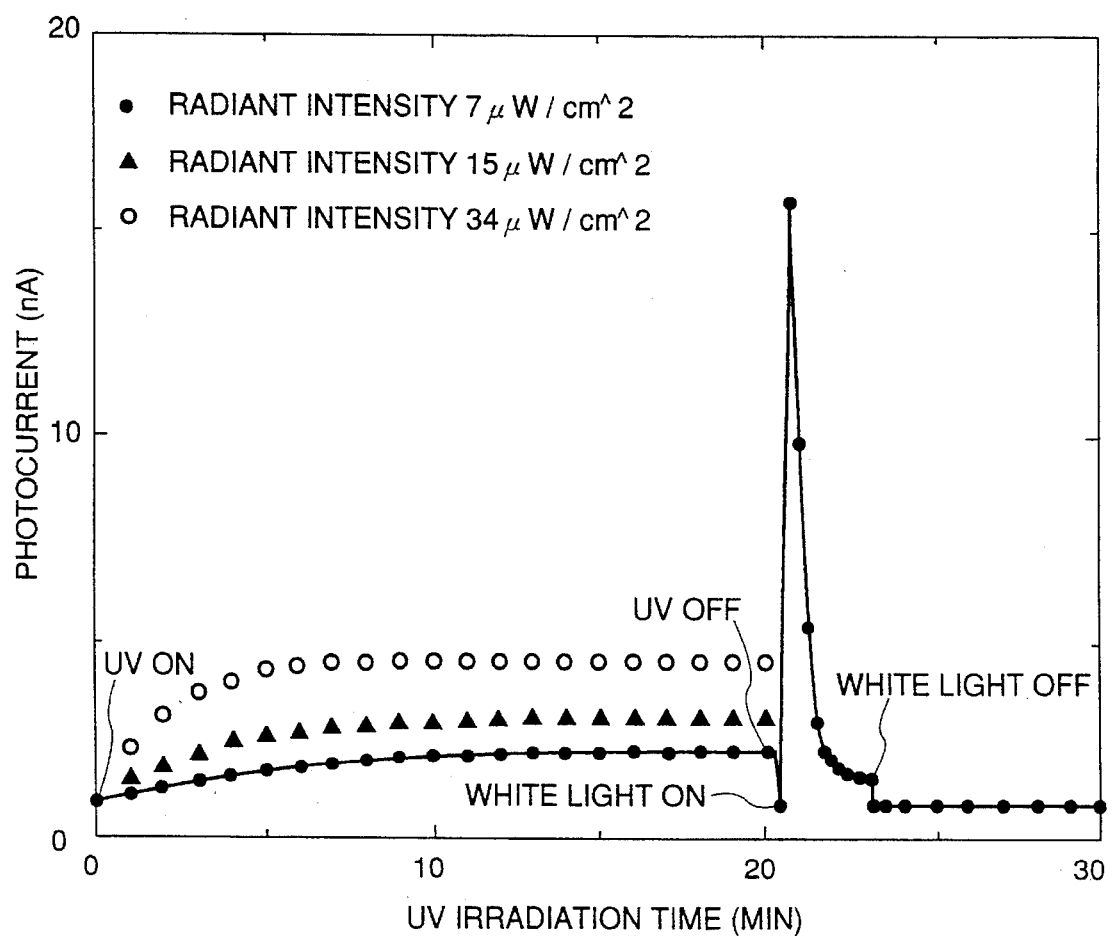
FIG. 3 is a diagram showing the relation of photocurrent to irradiation time when the ultraviolet detector shown in FIGS. 2(a) and 2(b) is irradiated with ultraviolet radiation, as well as photocurrent induced by subsequent illumination of white light.

FIG. 3 shows the relation of the photocurrent to the UV irradiation time when the above-described UV detector is illuminated with light having wavelengths of 180 to 350 nm, the light being emitted from the deuterium discharge lamp. That is, FIG. 3 indicates the dependence of the photocurrent induced in the UV detector shown in FIG. 2, (a) and (b), on time for the UV light having wavelengths of 180 to 350 nm. At this time, the photocurrent is measured by applying a certain voltage between the output electrodes 24 and 25 while illuminating the thin diamond film 21 with the light from the deuterium discharge lamp. Three curves are shown in FIG. 3. The curve indicated by the white circles was obtained when UV light of intensity 34 µW/cm$^2$ was emitted. The curve indicated by the black triangles was obtained when UV light of intensity 15 µW/cm$^2$ was emitted. The curve indicated by the black dots (interposed by curves) was obtained when UV light of intensity 7 µW/cm$^2$ was irradiated.

The right end of the curve indicated by the black dots indicates that the pulsed photocurrent flowed. This curve was derived by illuminating the thin diamond film 21 with white light having wavelengths of 360 to 800 nm after the end of illumination of UV light from the deuterium discharge lamp and measuring the induced photocurrent.

Figure 4:
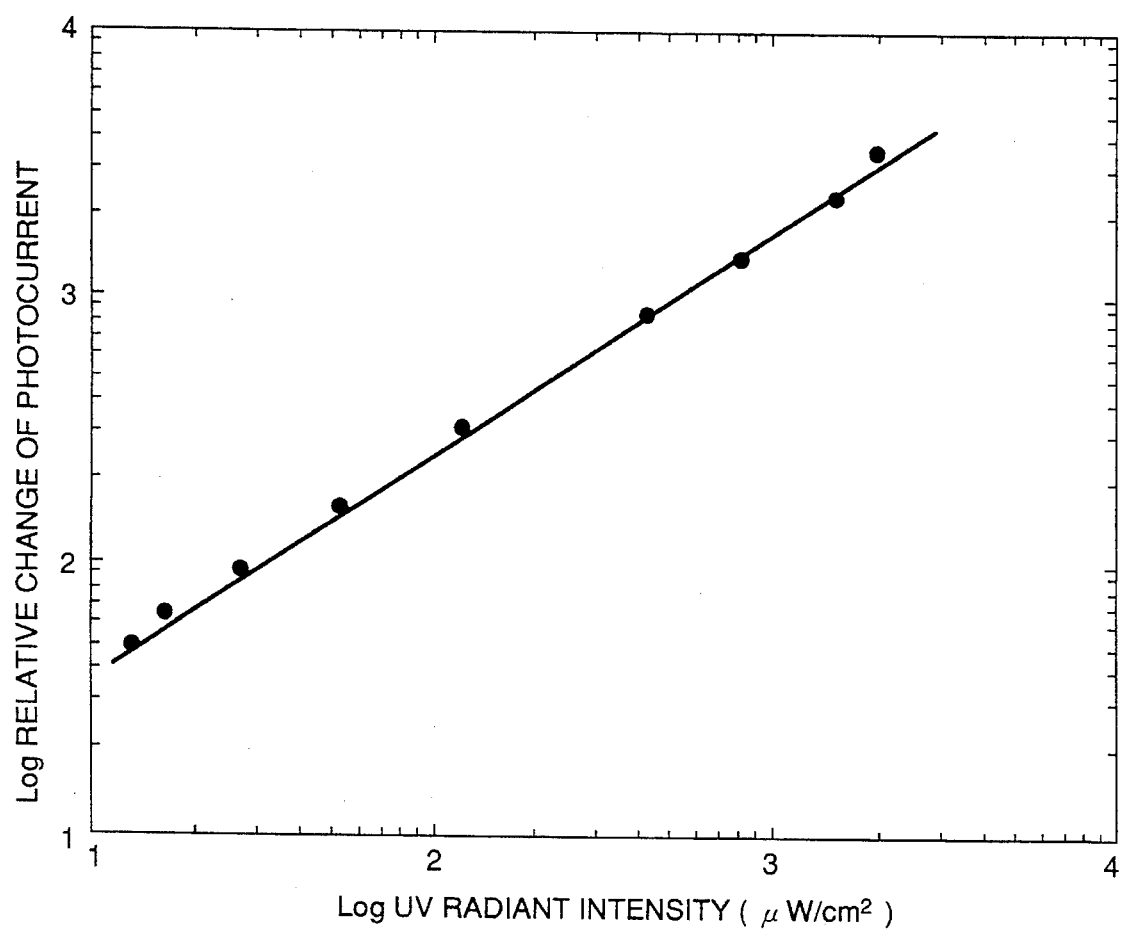
FIG. 4 is a diagram showing the relation of the photocurrent ratio to the UV radiant energy when the ultraviolet detector shown in FIGS. 2(a) and 2(b) is irradiated with ultraviolet radiation, the photocurrent ratio being the ratio of photocurrent induced in illuminated state to photocurrent induced in dark state.

It can be seen from FIG. 3 that the saturated value of the photocurrent varies, depending on the intensity of the illuminating light from the deuterium discharge lamp. Data about this relation is shown in FIG. 4, where logarithmic values of the intensity of illuminating light from the deuterium discharge lamp is plotted on the horizontal axis, while the logarithmic ratio of the photocurrent induced when the UV light is not emitted to the photocurrent saturated by illumination of the UV light is plotted on the vertical axis. That is, FIG. 4 shows the relation between the UV radiant intensity when the UV detector shown in FIG. 2, (a) and (b), is illuminated with UV light and the ratio of the photocurrent in illuminated state to the photocurrent in dark state. It can be seen from FIG. 4 that a clear proportional relationship exists between the intensity of UV light and the saturated photocurrent over a range of about three orders of magnitude.

Figure 5:
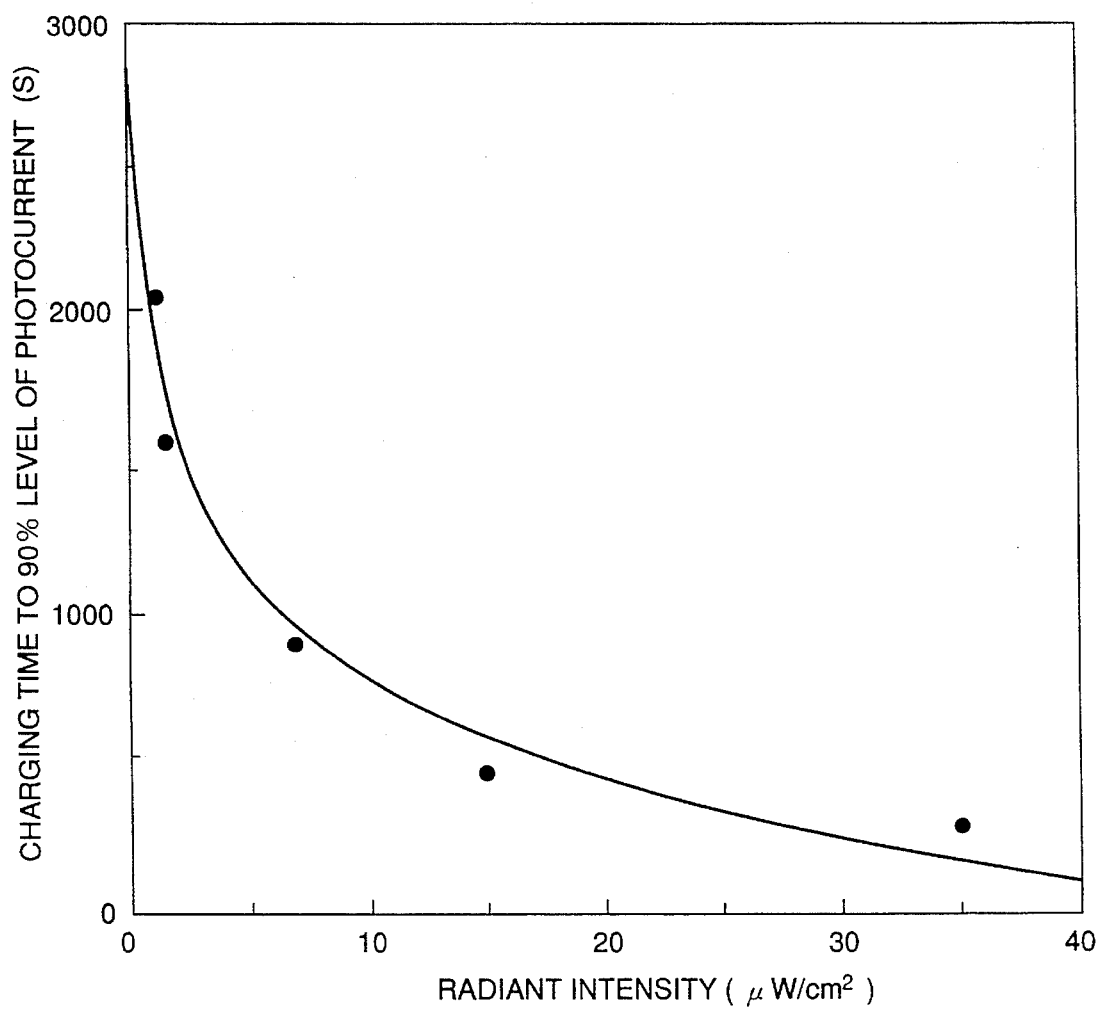
FIG. 5 is a diagram showing the relation of the time taken for photocurrent to reach 90% of the peak level to the radiant intensity when the ultraviolet detector shown in FIGS. 2(a) and 2(b) is irradiated with ultraviolet radiation.

In FIG. 5, the intensity of the UV light emitted from the deuterium discharge lamp is plotted on the horizontal axis, while the time taken for the photocurrent to reach 90% of the saturated level is plotted on the vertical axis. It can be seen from FIG. 5 that when the intensity of the UV light is weak, it takes a long time for the photocurrent to become saturated. However, when the intensity of the UV light is strong, it takes a short time for the photocurrent to become saturated.

Figure 6:
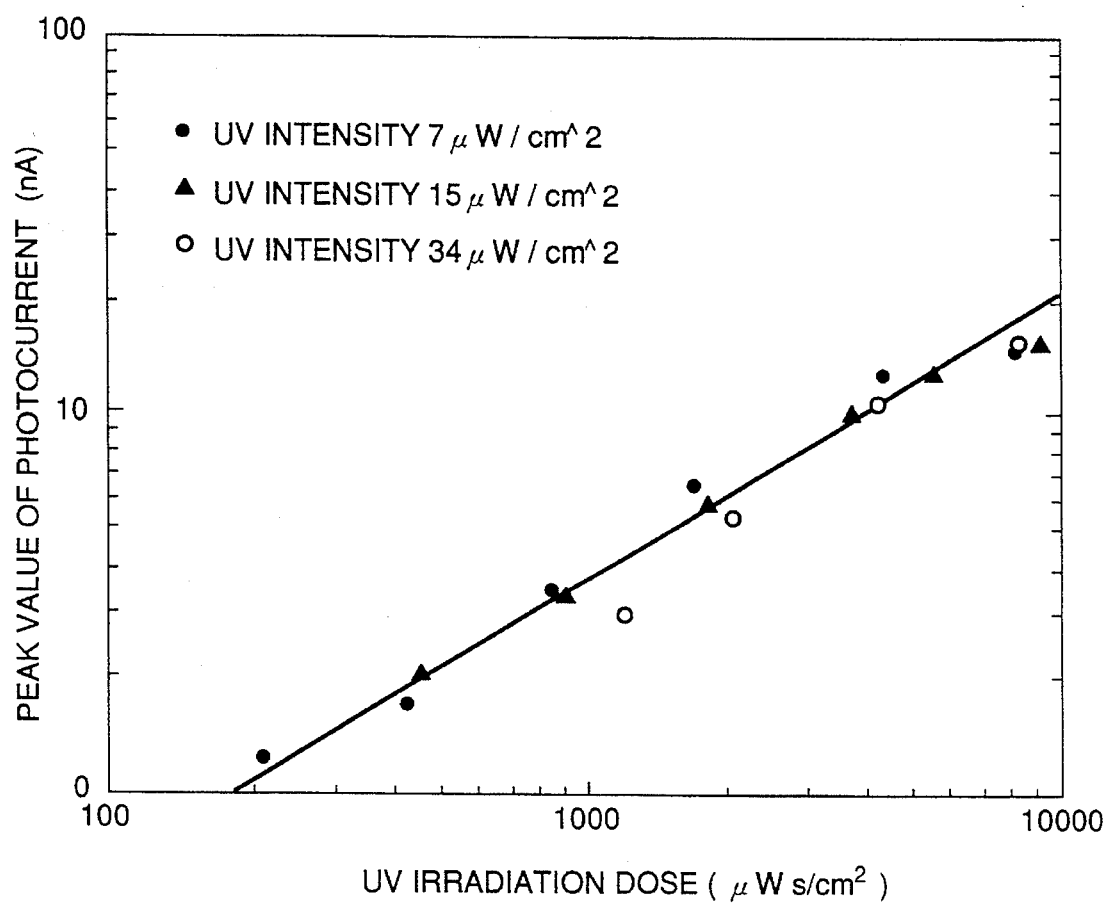
FIG. 6 is a diagram showing the relation of the peak value of photocurrent induced by illumination of white light to the UV dose of the ultraviolet detector shown in FIGS. 2(a) and 2(b) when it is irradiated with ultraviolet radiation.

The right side of the graph of FIG. 3 shows variations in the photocurrent occurring when the thin diamond film 21 is illuminated with white light after the film E1 is sufficiently illuminated with the UV light from the deuterium discharge lamp at a radiant intensity of 7 µm/cm$^2$. The relation of the peak value of the photocurrent induced by the white light after illumination of UV light to the UV irradiation dose from the deuterium discharge lamp is shown in FIG. 6. In FIG. 6, the dose of the UV light of the diamond film 21 is plotted on the horizontal axis, while the peak value of the photocurrent induced by illumination of the white light is plotted on the vertical axis. The amount of light is defined as (the radiant intensity)×(the irradiation time) and also known as dose. The amount of light is expressed in µWs/cm$^2$.

It can be seen from FIG. 6 that the peak value of the photocurrent induced in the thin diamond film 21 by illumination of white light after illumination of UV light has a proportional relation with the UV irradiation dose of the diamond film 21. We observe that points corresponding to values of the radiant intensity of UV light are roughly located on a straight line. In consequence, the peak value of the photocurrent induced by the illumination of the white light precisely reflects the irradiation dose rather than the irradiant intensity of the UV light.

We can conclude that the amount of the UV light which is emitted from the deuterium discharge lamp and falls on the thin diamond film 21 is determined from the peak value of the photocurrent induced in the diamond film 21 by illumination of the white light. That is, the white light can be used as reading light for reading the amount of UV light impinging on the diamond film.

After irradiation of the UV light, white light is emitted, thus inducing a photocurrent. The peak value of the photocurrent is measured. As shown on the right side of FIG. 3, as the white light is emitted, the peak value decreases gradually. The white light has wavelengths ranging from 360 to 800 nm.

Figure 7:
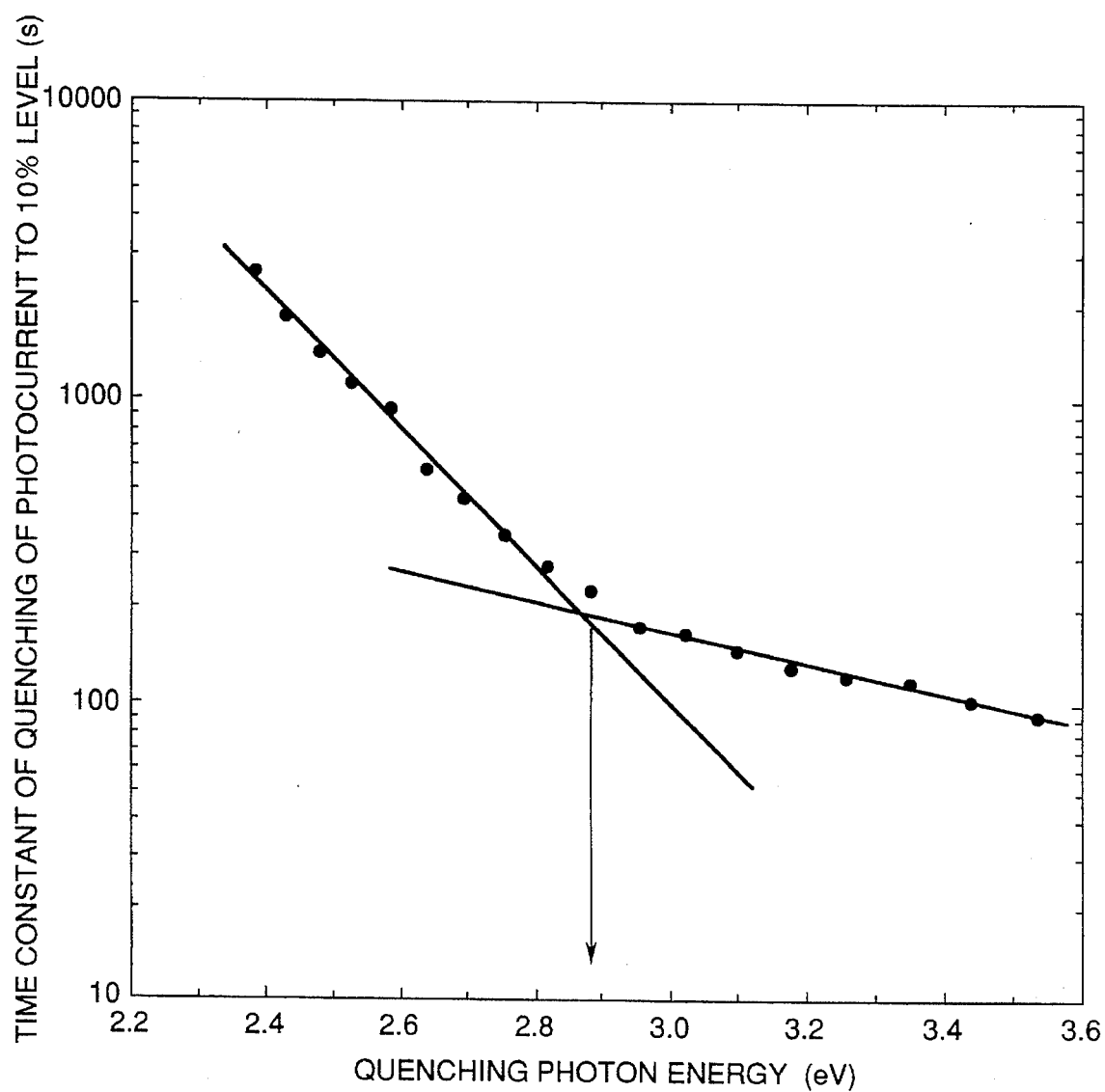
FIG. 7 is a diagram showing the relation of the time taken for photocurrent to decrease to 10% of the peak level to energies corresponding to the wavelengths of light impinging on the ultraviolet detector shown in FIGS. 2(a) and 2(b) after the detector is irradiated with ultraviolet radiation.

Data obtained when light having a single wavelength is used as the above-described reading light is shown in FIG. 7. In FIG. 7, energies (in eV) converted from wavelengths are plotted on the horizontal axis, whereas the time taken for the photocurrent induced when the reading light is emitted to decrease to 10% of its peak value is plotted on the vertical axis. It can be seen from FIG. 7 that as the energy of the wavelength of the reading light for reading the amount of the UV light decreases, i.e., as the wavelength is increased, the photocurrent decreases more slowly. As the energy of the wavelength of the reading light is increased, the photocurrent decreases more rapidly.

When the reading light is emitted continuously, the photocurrent decreases gradually as shown on the right side of FIG. 3 though the rate of decrease is affected by the wavelength. After the reading light is emitted sufficiently, i.e., after the photocurrent decreases sufficiently, if illumination of the reading light is once made to cease and then the illumination is restarted, then no photocurrent is produced as shown in FIG. 3. This means that illumination of a sufficient amount of reading light destroys information regarding the amount of illuminating UV light. In the example shown in FIG. 3, white light is used as the reading light. In this case, the information is read out in a short time, as shown in FIG. 3. However, utilizing this phenomenon, information written by UV light can be erased.

Where pulses of a short duration are used as reading light, the peak value of the photocurrent induced by the illumination of the reading light has a proportional relation with the UV irradiation dose, as shown also in FIG. 6. In this case, whenever each pulse is irradiated as reading light, the peak value of the photocurrent correctly reflecting the UV irradiation dose can be obtained. Hence, the UV irradiation dose can be read out plural times.

The number of these reading operations can be roughly known from the data shown in FIG. 7. As an example, light having a wavelength of about 520 nm having an energy corresponding to 2.4 eV is used as reading light. It is assumed that the illumination time required for one reading operation is on the order of milliseconds. The amount of the UV light impinging on the diamond film can be known by performing more than $10^3$ reading operations. If it is only necessary to know whether UV light is irradiated, more than $10^4$ reading operations can be carried out. Of course, if the wavelength of the pulsed light for reading is shortened, then the number of reading operations for precisely reading the amount of the UV light decreases with the tendency shown in FIG. 7.

Where pulsed light is used as reading light, if the radiant intensity is large, the number of accurate measurements of the UV dose is small. Conversely, if the radiant intensity is small, the number of measurements is large. What are obtained from the above considerations are summarized below.

(1) The amount of UV light having wavelengths of energies exceeding the energy bandgap of diamond can be measured by measuring the peak value of the photocurrent induced by reading light having wavelengths of energies less than the energy bandgap of the diamond. That is, information about the amount of UV light having wavelengths shorter than about 230 nm impinging on the diamond can be read by illuminating the diamond with the reading light having wavelengths longer than about 230 nm.

(2) A plurality of reading operations can be performed by using pulsed light as the reading light.

(3) The number of reading operations can be increased by using a longer wavelength of light as the reading light.

(4) The number of the reading operations can be increased by using reading light of lower intensity.

(5) Information regarding the amount of the illuminating UV light can be erased by using white light.

In order to understand the mechanism by which information about the amount of the illuminating UV light is stored in the diamond, a model of operation is now considered. Referring again to FIG. 1, the diamond is illuminated with light of less than about 5 eV to induce a photocurrent. Information about the illuminating UV light having energies exceeding about 5 eV can be obtained by measuring the produced photocurrent. Thus, we can consider that information concerning the illuminating UV light is distributed over the whole bandgap of about 5.5 eV of the diamond.

EXAMPLE 1

Referring to FIG. 2, (a) and (b), there is shown a UV detector according to the invention. FIG. 2(a) is a top view of the UV detector. FIG. 2(b) is a cross-sectional view taken on line A—A— of FIG. 2(a). This detector comprises a thin diamond film 21, a pair of electrodes 22, 23, and a pair of output electrodes 24, 25.

The thin diamond film 21 has a thickness of 15 μm and measures 1 mm×1 mm. This film was fabricated by microwave CVD in the presence of a magnetic field under the following conditions:

raw material: gaseous mixture of methyl alcohol and hydrogen substrate: silicon substrate substrate temperature: 800° C.

microwave output: 4 kW (2.45 GHz)

Under the above conditions, a thin diamond film was formed to a thickness of 15 μm on the silicon substrate by making use of the interaction between the magnetic field and the microwave of 2.45 GHz. The diamond film was peeled off from the substrate to obtain a simple, thin diamond film. This was sliced into a size 1 mm square. In this way, the thin diamond film 21 shown in FIG. 2, (a) and (b), was obtained. Then, a pair of electrodes 22, 23, and a pair of output electrodes 24, 25 were formed, thus completing a UV detector. The specific resistance of the diamond film 21 was in excess of $10^{12}$ Ωcm. No impurity was implanted to impart any conductivity type. Consequently, this thin diamond film is a substantially genuine diamond film.

EXAMPLE 2

FIG. 2(c) shows a UV dosimeter using the UV detector of Example 1. This dosimeter comprises the UV detector 31 shown in FIG. 2, (a) and (b), a shutter 32 for blocking UV light 33 directed to the UV detector 31, a tungsten-halogen lamp 34 for illuminating the UV detector 31 with reading light 36 consisting of white light for reading the amount of UV light falling on the UV detector 31, a switch 35 for turning on and off the tungsten-halogen lamp, a current source 37 for supplying an electric current into the UV detector 31, a power supply 38 for the tungsten-halogen lamp 34, and a measuring circuit portion 39 for detecting a photocurrent induced in the UV detector 31.

The measuring circuit portion 39 incorporates an amplifier for amplifying signals, an arithmetic portion for calculating the amount of the UV light impinging on the UV detector 31 from the peak value of the photocurrent, a first memory in which conditions necessary to perform arithmetic operations are stored, and a second memory for recording results of measurements at given intervals of time. The tungsten-halogen lamp 34 is designed to emit white light at regular intervals of time.

The UV dosimeter shown in FIG. 2(c) is able to measure UV radiation having wavelengths shorter than about 230 nm corresponding to 5.5 eV that is the energy bandgap of the thin diamond film 21.

This UV dosimeter operates in the manner described below. Before the operation, the relation between the amount of UV light to be measured and the photocurrent detected by the measuring circuit portion 39 is measured and stored in the first memory. This relation is a proportional relation as shown in FIG. 6, where a deuterium discharge lamp is used as a UV light source. Of course, the proportional relation differs according to the environment in which measurements are made.

First, this UV dosimeter is installed in a location where the amount of the UV light should be measured. The shutter 32 is opened for a given time to expose the UV detector 31 to UV light 33. Then, the shutter 32 is closed, and the tungsten-halogen lamp 34 is lit up. At this time, a photocurrent is induced in the thin diamond film 21. The peak value of the photocurrent is measured by the measuring circuit portion 39 and compared with the above-described relation between amounts of UV light and the photocurrent, the relation being previously stored in the second memory. The amount of the illuminating UV light 33 is calculated from the photocurrent measured actually. If necessary, the calculated amount of UV light is stored in the second memory. If the times for which the shutter is opened and closed, respectively, have been previously set, then the average radiant intensity of the UV light 33 can be known. Since the lamp 34 is emitting white light, information about the amount of the UV light 33 stored in the diamond film 21 is erased simultaneously with reading, by appropriately selecting the intensity and the irradiation time of the white light. Therefore, the amount of irradiation can be measured at regular intervals of time by appropriately setting the times for which the shutter 32 is opened and closed, respectively, the intervals at which the shutter 32 is opened or closed, the time for which the tungsten-halogen lamp is lit up, and the intervals at which the lamp is lit up.

Furthermore, rapid variations in the amount of the illuminating UV light 33 or in the radiant intensity can be detected by setting short the intervals at which the shutter 32 is opened and closed, setting short the intervals at which the tungsten-halogen lamp 34 is turned on and off, and measuring the amount of the illuminating UV light at shorter intervals of time. Of course, the intensity of the UV light can also be measured.

The operations described thus far can be performed by a simple electronic circuit made up of the arithmetic circuit and semiconductor memories incorporated in the measuring circuit portion 39. In the above-described structure, the amount of the UV light can be measured by turning on and off the tungsten-halogen lamp 34 while the UV detector 31 is being exposed to the UV light 33 without opening and closing the shutter 32.

In the configuration described above, white light from the tungsten-halogen lamp 34 is used as reading light. For example, if the light source 34 emits light of a single wavelength such as a He—Ne laser producing a wavelength of 633 nm, and if pulsed light is used as reading light, then information about the amount of UV light written into the UV detector 31 can be read out plural times without erasing the information.

EXAMPLE 3

In the present example, the UV dosimeter shown in FIG. 2, (a)–(c), is used in practice. The UV dosimeter shown in FIG. 2(c) can be made compact and can be operated with a small amount of electric power consumed. Hence, a small sized, portable UV dosimeter can be built.

Contemplated examples of usage of this UV dosimeter are as follows.

(A) This is used as a dosimeter which can be carried by a person in locations where he or she might be adversely affected by UV light. The dosimeter is used to measure the UV dose at regular intervals of time or to measure the total UV dose.

(B) It is known that UV light is used to sterilize foods and foodstuffs. The UV dosimeter is used as a dosimeter for measuring the amount of the UV light.

(C) The UV dosimeter is used as a dosimeter for measuring the amount of UV light in the outer space.

Where the usage (A) described above is considered, the effects of light having wavelengths longer than about 230 nm present problems as described above. In the present invention, therefore, the shutter 32 shown in FIG. 2(C) is equipped with a filter which transmits light having wavelengths shorter than about 230 nm and reflects light having wavelengths longer than about 230 nm, to prevent the UV detector 31 from being illuminated with light having wavelengths longer than about 230 nm when the detector is being illuminated with UV light having wavelengths shorter than about 230 nm.

In this structure, the amount of UV light having wavelengths shorter than about 230 nm can be measured precisely. The method of operation is the same as the method described in connection with Example 2.

In the present example, this filter is made of a copper plate which transmits light having wavelengths corresponding to energies higher than 5.5 eV and reflects light having wavelengths corresponding to energies lower than 5.5 eV.

To impart the above-described property to the copper plate, the number of free electrons in the copper is controlled. Specifically, during fabrication of the copper plate, the annealing step is controlled for this purpose. The frequency of the boundary between reflection and transmission of electromagnetic waves or light is determined by the kind of free electron metal and by the method of fabrication. The required frequency is selected, and the filter is fabricated.

In the polar regions where the effects of UV light present problems due to destruction of the ozone layer, the structure of the present example permits fabrication of a UV dosimeter for measuring the amount of UV radiation having wavelengths shorter than about 230 nm.

EXAMPLE 4

The present example relates to a memory from which information can be read and written by the use of reading light and writing light, respectively. UV light having wavelengths shorter than about 230 nm, i.e., having energies greater than about 5.5 eV, is used as the writing light. Light having wavelengths longer than about 230 nm is used as the reading light.

In the present example, it is possible to know whether the thin diamond film is irradiated with UV light. Also, information about the amount of UV light can be read. Fundamental data is shown in FIG. 6. Consequently, information about various amounts of UV light can be treated.

Figure 8A:
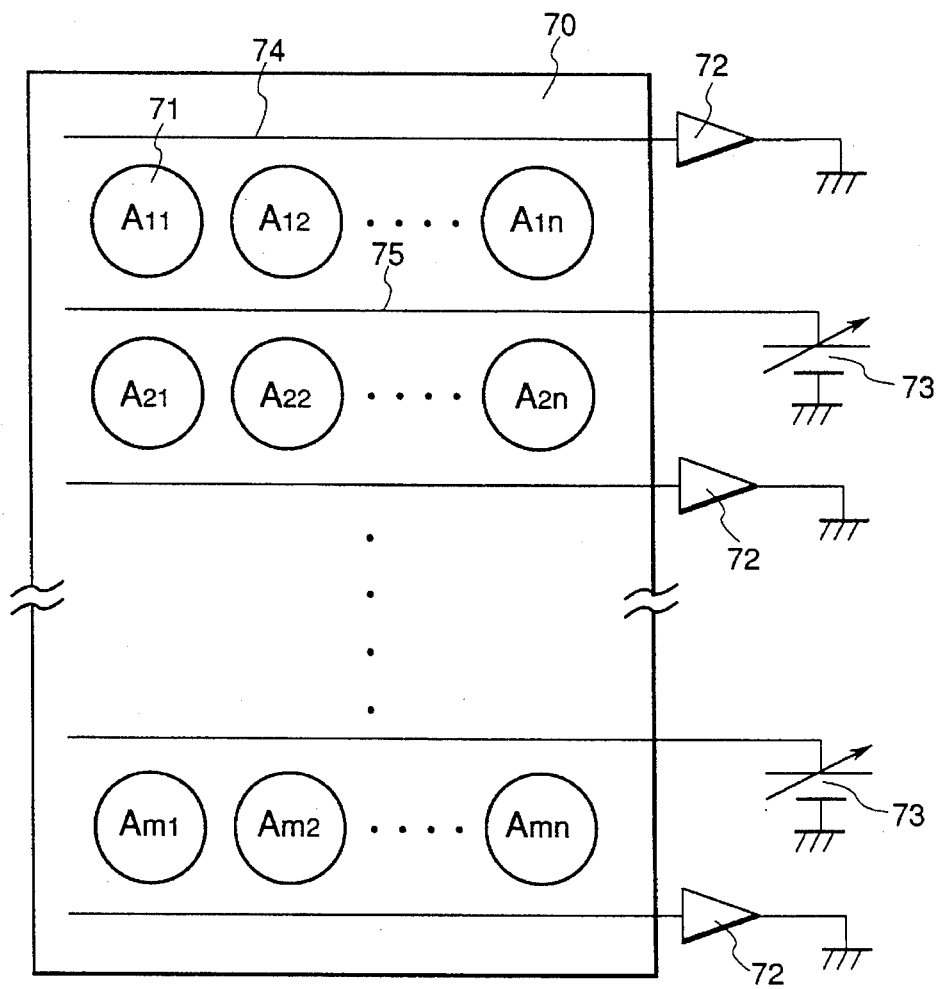
FIG. 8(a) is a schematic diagram of a memory according to the invention.

The present example is schematically shown in FIG. 8(a), where regions 71 formed on a thin diamond film 70 for forming memory regions, reading interconnects 74, feeding interconnects 75, a current amplifier 72 for amplifying and measuring a photocurrent induced in the memory regions 71, and a voltage source 73 for applying a voltage between the feeding interconnects 75 and the reading interconnects 74 are shown. Voltages are applied across the memory regions 71 on the diamond film between the reading interconnects 74 and the feeding interconnects 75. The current amplifier 72 is capable of measuring the peak value of the photocurrent, calculating the amount of UV light falling on the memory regions 71 from the peak value of the photocurrent, and calculating stored information from the calculated amount of UV light.

The thin diamond film is fabricated by microwave CVD in the presence of a magnetic field in the same way as in Example 1. Other chemical vapor deposition method may also be used. The thin film 70 is made of substantially genuine diamond in which any impurity for imparting one conductivity type has not been implanted.

In the operation, the memory regions 71 are irradiated with UV light. Information according to the amount of the irradiating UV light is written. To read out the information, the memory regions 71 are illuminated with laser light or the like having a wavelength longer than 230 nm. The photocurrent induced in the memory regions 71 is detected by the current amplifier. In this way, the information previously written can be read out.

As an example, the reading interconnects 74 and the feeding interconnects 75 are arranged alternately such that the memory regions 71 are spaced more than 3 μm from each other. In this case, in order to write information, UV light having wavelengths shorter than about 230 nm is finely focused to a size of about 2 μm by a lens. The UV light is emitted by a deuterium discharge lamp, for example. Memory regions $A_{11}$, $A_{12}$, $A_{13}$, $A_{14}$, . . . , $A_{1n}$ which are spaced 3 μm from each other are illuminated with the focused UV beam in such a way that the amount of light is adjusted so as to reflect the information to be written by a shutter and a light attenuator. Similarly, regions $A_{21}$, $A_{22}$, $A_{23}, A_{24}, \ldots, A_{2n}$ are illuminated.

In order to read out the information written in this way, laser radiation having a wavelength of 633 nm and emitted from a He—Ne laser is focused to a size of the order of 2 μm and scans the memory regions $A_{11}, A_{12}, A_{13}, A_{14}, \ldots, A_{1n}$ which have information already stored therein. In synchronism with the scan, the peak value of the photocurrent induced in the memory regions and in response to illumination of the laser radiation is measured by the current amplifier. The information written into the memory regions with UV light can be detected from the peak value of the photocurrent.

Figure 8B:
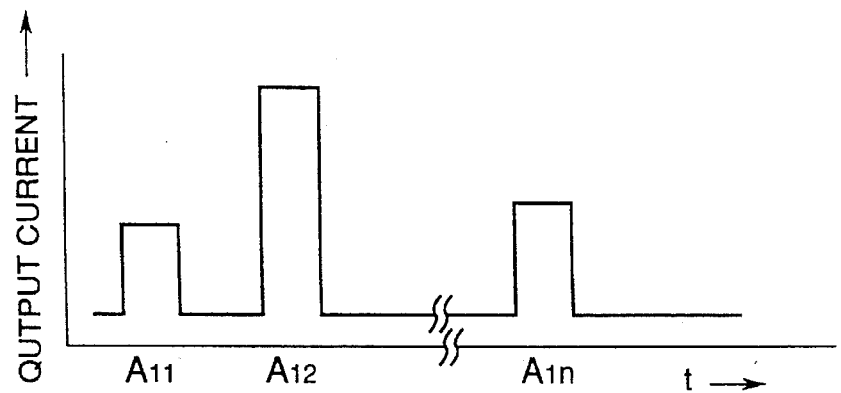
FIG. 8(b) is a diagram showing the output waveform from the memory shown in FIG. 8(a).

The information read out in this way takes the form of a signal as shown in FIG. 8(b). Importantly, information proportional to the amount of the writing UV light is written into each memory region and so it is not only possible to know whether UV light has been emitted; rather different kinds of information can be stored in each memory region, as shown in FIG. 8(b).

As can be seen from FIG. 6, information proportional to the amount of the writing UV light impinging on the thin diamond film can be delivered, and can be expressed correctly in terms of at least two figures. Therefore, information of 8 bits, i.e., capable of taking 256 different states, can be written into each one memory region on the diamond film. Furthermore, information having continuous value corresponding to the amount of the irradiating UV light can be treated.

For example, in the configuration shown in FIG. 8(a), each electrode is 1 μm wide, and each memory region 71 formed on the thin diamond film 70 is 3 μm square. If only binary information indicating ON or OFF state is stored in each memory region, then only about 62 k bytes of information can be stored in an area 1 mm square. If about 8 bits of information are stored in each memory region, then 0.5M bytes of information can be stored in the same area. Hence, 50M bytes of information can be stored in an area of 1 cm².

Where a He—Ne laser light is used as reading light, a rough calculation from FIG. 7 indicates that thousands of reading operations can be performed, since the wavelength of 633 nm of He—Ne laser corresponds to about 2 eV. If it is desired to erase information stored in the memory, all the information can be erased by irradiating the whole memory with white light. Of course, memory information can be partially erased by selectively illuminating the memory with white light.

In the above examples, the thin diamond film is fabricated by microwave CVD in the presence of a magnetic field. Other CVD method may also be used to fabricate a thin diamond film. Furthermore, other synthetic diamond fabricated by a method other than CVD may be employed. In addition, a natural diamond can be used. Moreover, the shape and the thickness of the thin diamond film may be selected according to the manner in which the invention is practiced. Further, a diamond doped with an impurity to impart one conductivity type can be used.

In the present invention, information about the amount of UV light impinging on a diamond can be read by measuring the photocurrent induced by illumination of visible light. A UV dosimeter can be built, using this function.

With the above-described memory, binary information indicating ON or OFF state can be read and written, using UV light having an amount of light corresponding to given information as writing light. Additionally, information corresponding to the amount of writing UV light can be read and written.

Since visible light is used as reading light, it is unlikely that the reading resolution is deteriorated due to heating. Furthermore, information can be erased by illumination of white light which does not produce local heating. In consequence, deterioration does not occur even after repeated use.

In the present invention, binary information indicating ON or OFF state can be written into plural memory regions formed on the surface of the diamond surface. In addition, more kinds of information can be treated. Therefore, the present invention can be applied to arithmetic elements and neuro computer elements using light.

What is claimed is:

1. An electronic device comprising:

a substance to be illuminated with ultraviolet radiation, said substance comprising a material selected from a group consisting of diamond, boron nitride, aluminum nitride and a multi-layer thereof:

means for irradiating said substance with said ultraviolet radiation using a first light;

means for illuminating said substance with a second light having a wavelength corresponding to an energy smaller than an energy bandgap of said substance to induce a photocurrent in said substance; and means for measuring said photocurrent.

2. The device of claim 1 further comprising means for determining an amount of light of an ultraviolet radiation impinging on said substance from a peak value of said photocurrent.

3. The device of claim 2 wherein said ultraviolet radiation impinging on said substance has a wavelength of 230 nm or shorter.

4. The device of claim 2 wherein said ultraviolet radiation impinging on said substance is emitted from a deuterium lamp.

5. The device of claim 1 wherein said illuminating means is a laser or a halogen lamp.

6. The device of claim 1 wherein said energy smaller than said energy bandgap of said substance is 5.5 eV or less.

7. An electronic device comprising:

means for illuminating a substance with ultraviolet radiation using a first light having an amount of radiation in accordance with a predetermined information, said substance comprising a material selected from the group consisting of diamond, boron nitride, aluminum nitride and a multi-layer thereof;

means for illuminating said substance with a second light having a wavelength corresponding to an energy smaller than an energy bandgap of said substance to induce a photocurrent in said substance;

means for measuring a peak value of said photocurrent; and means for obtaining said predetermined information from said peak value of said photocurrent.

8. An electronic device comprising:

a plurality of storage regions provided on a substance comprising a material selected from a group consisting of diamond, boron nitride, aluminum nitride, and a multi-layer thereof;

means for illuminating said storage regions with ultraviolet radiation using a first light;

means for illuminating said storage regions with a second light having a wavelength corresponding to an energy smaller than an energy bandgap of said substance to induce a photocurrent in said storage regions; and means for measuring said photocurrent.

9. The device of claim 8 wherein said ultraviolet radiation has an amount of radiation in accordance with a predetermined information, and said measuring means measures a peak value of said photocurrent, and said device further comprises means for obtaining said predetermined information from said peak value of said photocurrent.

10. The device of claim 8 wherein said energy smaller than the energy bandgap of said diamond is 5.5 eV or less.

11. The device of claim 8 wherein said ultraviolet radiation has a wavelength of 230 nm or shorter.

12. An electronic device comprising:

a substance comprising a material selected from a group consisting of diamond, boron nitride, aluminum nitride and a multi-layer thereof;

a filter for attenuating light having wavelengths corresponding to energies less than an energy bandgap of said substance;

means for illuminating said substance with light having a wavelength corresponding to an energy less than said energy bandgap of said substance to induce a photocurrent in said substance; and means for measuring said photocurrent.

13. A method of operating an electronic device equipped with a substance comprising a material selected from a group consisting of diamond, boron nitride, aluminum nitride, and a multi-layer thereof, said method comprising the steps of:

illuminating said substance with ultraviolet radiation using a first light;

illuminating said substance with a second light having a wavelength corresponding to an energy smaller than an energy bandgap of said substance to induce a photocurrent in said substance;

measuring said photocurrent; and obtaining information in accordance with an amount of light of said ultraviolet radiation from said photocurrent.

14. The method of claim 13 wherein said amount of light is measured by detecting a peak value of said photocurrent.

15. The method of claim 13 wherein said energy smaller than the energy bandgap of said diamond is 5.5 eV or less.

16. A method of operating an electronic device equipped with a substance comprising a material selected from a group consisting of diamond, boron nitride, aluminum nitride and a multi-layer thereof, said method comprising the steps of:

illuminating said substance with ultraviolet radiation using a first light having an amount of radiation in accordance with a predetermined information to write said predetermined information into said substance;

illuminating said substance with a second reading light having a wavelength corresponding to an energy smaller than an energy bandgap of said substance to induce a photocurrent in said substance; and reading said predetermined information from said substance according to a peak value of said photocurrent.

17. The method of claim 16 wherein a plurality of reading operations are performed per writing operation by using pulsed light as said reading light.

18. The method of claim 16 wherein the information written with said ultraviolet radiation is erased by using white light as said reading light.

19. The method of claim 16 wherein said energy smaller than the energy bandgap of said substance is 5.5 eV or less.

20. A method of operating an electronic device equipped with a substance comprising a material selected from a group consisting of diamond, boron nitride, aluminum nitride and a multi-layer thereof, said substance having a predetermined information stored therein, said method comprising the steps of:

illuminating said substance with light having a wavelength corresponding to an energy smaller than an energy bandgap of said substance to thereby read said predetermined information from said substance.

21. A light sensor comprising:

a photosensitive layer having an energy bandgap;

a means for irradiating said photosensitive layer with a first light having a wavelength which is not longer than the wavelength corresponding to said energy bandgap;

means for irradiating said photosensitive layer with a second light having a wavelength which is longer than the wavelength corresponding to said energy bandgap; and a means for measuring a current passing through said photosensitive layer during the irradiation of said second light.

22. The sensor of claim 21 wherein said photosensitive layer comprises a material selected from the group consisting of diamond, boron nitride and aluminum nitride.

23. The sensor of claim 21 wherein said photosensitive layer has a trap level capable of trapping photogenerated charges induced by said first light.

24. The sensor of claim 21 wherein said photosensitive layer comprises a diamond.

25. The sensor of claim 24 wherein said first light is a UV light and said second light is an infrared light.

* * * * *